US007016793B2

(12) United States Patent
Ye et al.

(10) Patent No.: US 7,016,793 B2
(45) Date of Patent: Mar. 21, 2006

(54) METHOD AND APPARATUS FOR ANTI-ISLANDING PROTECTION OF DISTRIBUTED GENERATIONS

(75) Inventors: Zhihong Ye, Clifton Park, NY (US); Vinod John, Montpelier, VT (US); Changyong Wang, Shanghai (CN); Luis Jose Garces, Schenectady, NY (US); Rui Zhou, Clifton Park, NY (US); Lei Li, Shanghai (CN); Reigh Allen Walling, Clifton Park, NY (US); William James Premerlani, Scotia, NY (US); Peter Claudius Sanza, Niskayuna, NY (US); Yan Liu, Schenectady, NY (US); Mark Edward Dame, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 139 days.

(21) Appl. No.: 10/677,559

(22) Filed: Oct. 1, 2003

(65) Prior Publication Data

US 2006/0004531 A1 Jan. 5, 2006

(51) Int. Cl.
*G01R 21/00* (2006.01)
*H02J 1/00* (2006.01)
*H02M 7/00* (2006.01)

(52) U.S. Cl. .......................... 702/60; 702/65; 290/40 B; 290/40 C; 307/30; 307/45; 318/762; 318/763; 318/767; 361/60; 361/62; 363/109; 363/116; 363/120; 700/286; 700/292

(58) Field of Classification Search .................. 702/60, 702/65; 290/40 B, 40 C; 307/30, 45; 318/762, 318/763, 767; 361/60, 62; 363/109, 116, 363/120; 700/286, 292
See application file for complete search history.

(56) References Cited

U.S. PATENT DOCUMENTS

| 5,111,377 A | 5/1992 | Higasa et al. ............. 363/95 |
| 6,219,623 B1 | 4/2001 | Wills ........................ 702/60 |
| 6,429,546 B1 | 8/2002 | Ropp et al. ................ 307/31 |

OTHER PUBLICATIONS

Stevens, John et al. "Development and Testing of an Approach to Anti-Islanding in Utility-Interconnected Photovoltaic Systems," *SANDS 2000-1939*, Albuquerque, NM: Sandia National Laboratories, Aug., 2000.
Ropp, M.E. et al. "Analysis and Performance Assessment of the Active Frequency Drift Method of Islanding Prevention," *IEEE Transactions on Energy Conversion*, IEEE: vol. 14, No. 3, Sep. 1999.

*Primary Examiner*—Bryan Bui
*Assistant Examiner*—Hien Vo
(74) *Attorney, Agent, or Firm*—Cantor Colburn LLP (57) ABSTRACT

An apparatus for anti-islanding protection of a distributed generation with respect to a feeder connected to an electrical grid is disclosed. The apparatus includes a sensor adapted to generate a voltage signal representative of an output voltage and/or a current signal representative of an output current at the distributed generation, and a controller responsive to the signals from the sensor. The controller is productive of a control signal directed to the distributed generation to drive an operating characteristic of the distributed generation out of a nominal range in response to the electrical grid being disconnected from the feeder.

33 Claims, 7 Drawing Sheets

METHOD AND APPARATUS FOR ANTI-ISLANDING PROTECTION OF DISTRIBUTED GENERATIONS

FEDERAL RESEARCH STATEMENT

This invention was made with Government support under contract NAD-1-30605-01 awarded by the Department of Energy. The Government has certain rights in this invention.

BACKGROUND OF THE INVENTION

The present disclosure relates generally to a method and apparatus for anti-islanding protection of a distributed generation from a feeder having been disconnected from an electrical grid, and particularly to the anti-islanding protection of an inverter providing AC (alternating current) power, via a DC (direct current) source, to a feeder that is normally connected to an electrical grid.

The distribution of electric power from utility companies to customers utilizes a network of utility lines connected in a grid-like fashion, referred to as an electrical grid. The electrical grid may consist of many independent energy sources energizing the grid in addition to utility companies energizing the grid, with each independent energy source being referred to as a distributed generation (DG). Each DG includes some type of power conditioner or converter, like an inverter for example, that feeds power to the feeder system of the grid. Exemplary DG's include but are not limited to energy storages (such as battery, or flywheel, for example), photovoltaics, micro-turbines, fuel cells, engine-generator sets, and wind-turbine-generator sets. A typical feeder system consists of distribution lines that provide power from the grid or DG to a customer load via electrical disconnects and distribution transformers. Even with the presence of a DG connected to the grid, the utility company is still the main source of power and in many cases controls the system voltage and frequency within nominal values.

Under certain conditions, the utility power source may be disconnected from the grid and feeder system, leaving the DG directly tied to the load or disjointed grid branch, which is referred to as islanding. The isolated section of the grid being powered by the DG is referred to as an island. Unintentional islanding results in a situation where the voltages and frequencies on the disjointed grid branch are outside of the direct control of the utility company because that branch is primarily energized by one or more DG. Accordingly, monitoring and disconnect schemes, referred to as anti-islanding schemes, are used to timely disconnect a DG from the feeder in the event that grid power from a utility company has been disconnected from the feeder.

Anti-islanding schemes presently used or proposed include passive schemes and active schemes. Passive schemes are based on local monitoring of the grid signals, such as, under or over voltage, under or over frequency, rate of change of frequency, phase jump, or system harmonics, for example. Active schemes are based on active signal injection with monitoring of the resulting grid signals, such as impedance measurement for example, or active signal injection with active controls, such as active frequency shifting or active voltage shifting for example. With passive schemes, close power matching between the DG output and the total load may result in a sustained island due to the voltage and frequency holding within nominal ranges. With active schemes, some distortion may occur in the output current waveform, thereby resulting in a tradeoff between islanding detection time and waveform distortion, with faster detection typically resulting in higher total harmonic distortion (THD). Accordingly, there is a need in the art for an anti-islanding arrangement that overcomes these drawbacks.

SUMMARY OF THE INVENTION

In one embodiment, an apparatus for anti-islanding protection of a distributed generation with respect to a feeder connected to an electrical grid is disclosed. The apparatus includes a sensor adapted to generate a voltage signal representative of an output voltage and/or a current signal representative of an output current at the distributed generation, and a controller responsive to the signals from the sensor. The controller is productive of a control signal directed to the distributed generation to drive an operating characteristic of the distributed generation out of a nominal range in response to the electrical grid being disconnected from the feeder.

In another embodiment, a controller for anti-islanding protection of a distributed generation with respect to a feeder of an electrical grid is depicted. The distributed generation is adapted for connection to the feeder via a distributed generation disconnect. The distributed generation disconnect is responsive to a voltage/frequency monitor. The controller includes: an input converter adapted to transform a voltage signal from the distributed generation from stationary coordinates to rotating coordinates; an input converter adapted to transform a current signal from the distributed generation from stationary coordinates to rotating coordinates; a frequency signal generator adapted to provide a frequency signal representative of an output frequency of the distributed generation; a current regulator adapted to provide a control signal to the distributed generation; an integrator responsive to the voltage signal, the current signal, or the frequency signal, and adapted to provide an integrated signal to the current regulator; and, an output converter responsive to the control signal, or the frequency signal, and adapted to transform the control signal from rotating coordinates to stationary coordinates. In response to a disconnected electrical grid, the voltage and/or frequency at the distributed generation is driven away from a nominal range and the distributed generation disconnect is opened, thereby isolating the distributed generation with respect to the feeder.

In a further embodiment, a method for anti-islanding protection of a distributed generation with respect to a feeder connected to an electrical grid is disclosed. The method includes: determining an output voltage of the distributed generation; determining an output current of the distributed generation; determining an output voltage variation of the distributed generation; modifying a current reference of the distributed generation in response to the output voltage variation; determining an output frequency of the distributed generation in response to the output voltage; and, providing a control signal in response to the output current, the modified current reference, and the output frequency, for disconnecting the distributed generation from the feeder in response to the electrical grid being disconnected from the feeder.

In another embodiment, a computer program product for anti-islanding protection of a distributed generation adapted for signal communication with an electrical grid is disclosed. The program includes a storage medium, readable by a processing circuit, storing instructions for execution by the processing circuit for: determining an output voltage of the distributed generation; determining an output current of the distributed generation; determining an output voltage variation of the distributed generation; modifying a current reference of the distributed generation in response to the output voltage variation; determining an output frequency of the distributed generation in response to the output voltage; and, providing a control signal in response to the output current, the modified current reference, and the output frequency, for disconnecting the distributed generation from a feeder in response to the electrical grid being disconnected from the feeder.

In a further embodiment, an apparatus for anti-islanding protection of a distributed generation with respect to a feeder connected to an electrical grid is disclosed. The apparatus includes: means for determining an output voltage of the distributed generation; means for determining an output current of the distributed generation; means for determining an output voltage variation of the distributed generation; means for modifying a current reference of the distributed generation in response to the output voltage variation; means for determining an output frequency of the distributed generation; and, means for providing a control signal in response to the output current, the modified current reference, and the output frequency, for disconnecting the distributed generation from the feeder in response to the electrical grid being disconnected from the feeder.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the invention provides an active anti-islanding scheme for a distributed generation (DG) in signal communication with an electrical grid via a DG disconnect, a feeder, and a grid disconnect. In response to the electrical grid being disconnected from the feeder, an embodiment of the active anti-islanding scheme described herein effectively disconnects the distributed generation from the feeder at the DG disconnect, thereby providing isolation of the feeder from the distributed generation in the event the feeder is disconnected from the electrical grid.

While an embodiment of the invention depicts a photovoltaic cell array as an exemplary power source, it will be appreciated that other power sources may also be used, such as a fuel cell system, an engine-generator set, a wind-turbine-generator set, or a micro-turbine system, for example. Furthermore, while an embodiment of the invention may be depicted having single-phase or three-phase connections, it will be appreciated that embodiments of the invention are applicable to a variety of power system connection schemes, including but not limited to a single-phase two-wire system, a two-phase three-wire system, a three-phase three-wire system, a three-phase four-wire system, or any multi-phase system.

The control scheme disclosed herein performs signal processing in rotating coordinates (DQ coordinates), which involves the transformation, called Park's Transformation, of the signals from stationary coordinates (ABC coordinates) to DQ rotating coordinates using matrix multiplication. The mathematics relating to Park's Transformation is well known in the art and may be found in several technical references.

Figure 1:
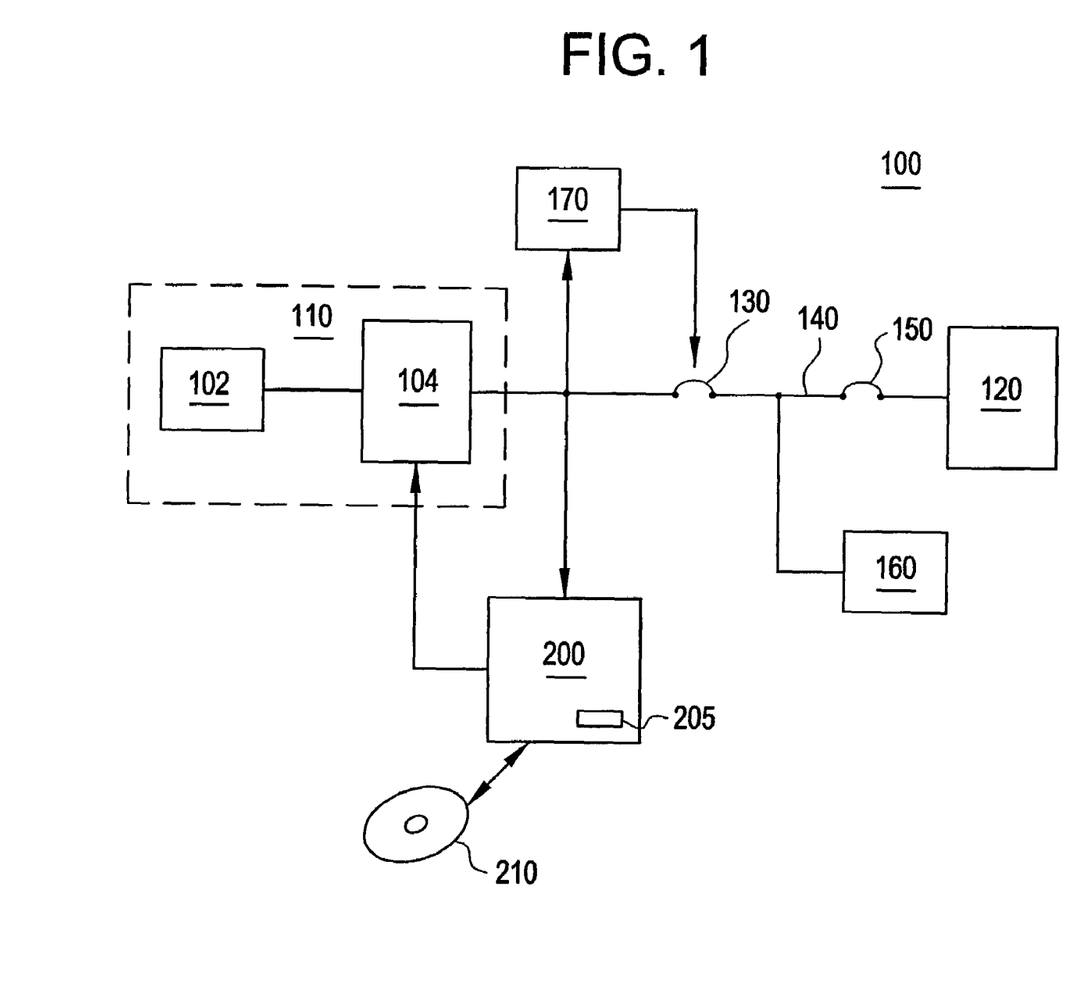
FIG. 1 depicts an exemplary embodiment of a power system for implementing an active anti-islanding controller and control scheme in accordance with an embodiment of the invention.

FIG. 1 depicts an exemplary embodiment of a power system 100 with an anti-islanding controller 200 in one-line diagram form. Power system 100 includes a distributed generation 110 in signal communication with an electrical grid 120 via a DG disconnect 130, a feeder 140, and a grid disconnect 150. In an embodiment, distributed generation 110 includes a power source 102, such as a photovoltaic cell array for example, and a power conditioner 104, such as a power inverter for example. Where power source 102 is a DC (direct current) source, power conditioner 104 may be a DC-to-AC (alternating current) inverter, and where power source 102 is an AC source, power conditioner 104 may be an AC-to-AC transformer. The load 160 may receive power from either electrical grid 120 or distributed generation 110. Electrical grid 120, when connected, regulates the voltage and frequency of power system 100 at nominal values. Distribution transformers (not shown) may be located between DG disconnect 130 and feeder 140, and between load 160 and feeder 140.

In signal communication with controller 200 and distributed generation 110 is a voltage/frequency monitor 170. As used herein, the "/" separator denotes that either or both elements may be present. For example, voltage/frequency monitor 170 denotes a voltage monitor, a frequency monitor, or both a voltage and a frequency monitor. Voltage/frequency monitor 170 is responsive to the output voltage and frequency of distributed generation 110 as controlled by controller 200, which is discussed in more detail later. In response to an over voltage condition, an under voltage condition, an over frequency condition, an under frequency condition, or any combination thereof, voltage/frequency monitor 170 initiates a trip action at DG disconnect 130, which in an embodiment may include a circuit breaker with a shunt trip.

In an embodiment, controller 200 includes a processing circuit 205 for executing instructions stored on a storage medium 210 for implementing an embodiment of the invention disclosed herein.

Figure 2:
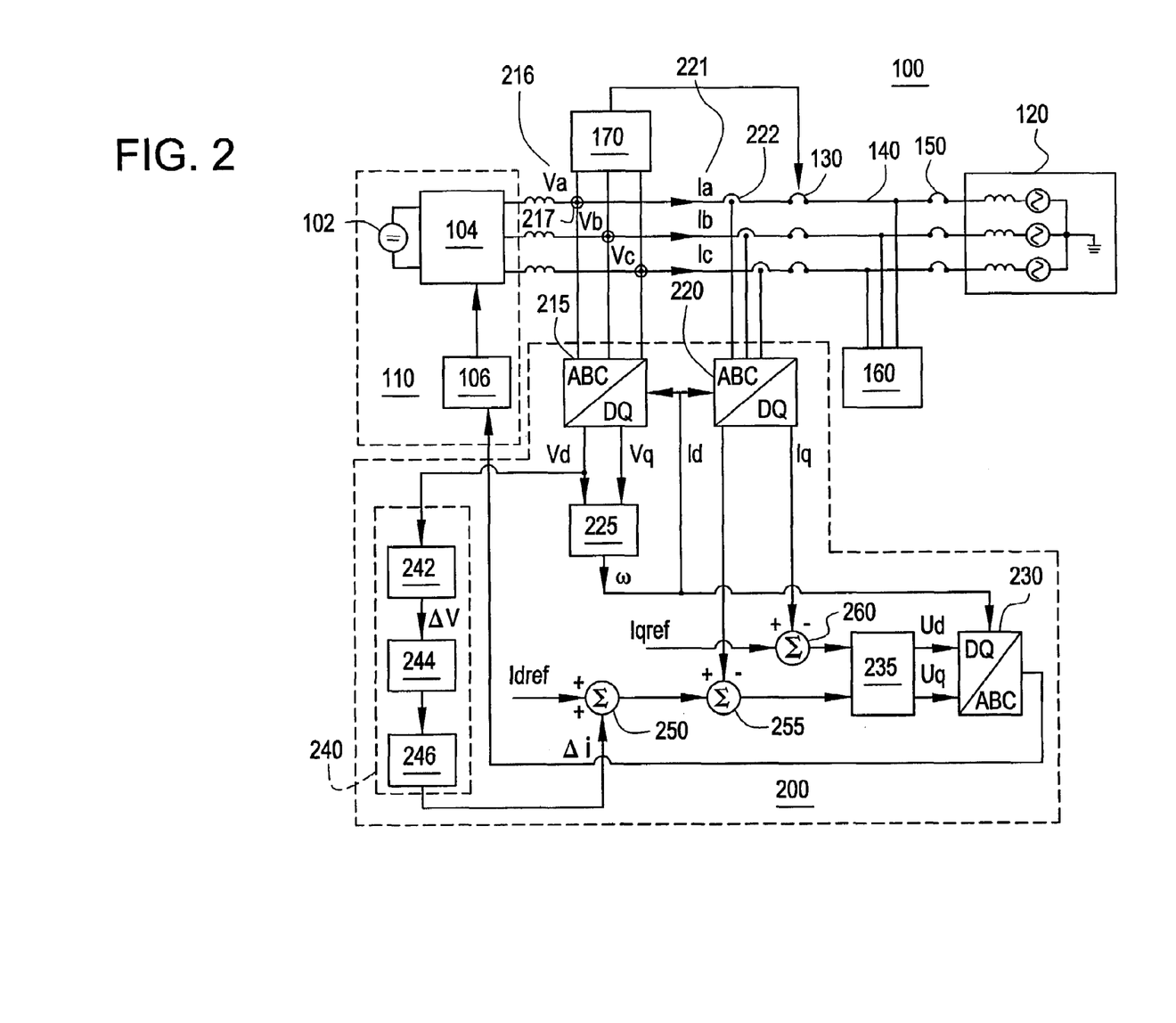
FIG. 2 depicts a more detailed view of an embodiment of the anti-islanding controller depicted in FIG. 1.

Referring now to FIG. 2, which depicts the power distribution portion of power system 100 in a three-phase diagram form and an embodiment of controller 200 in a one-line diagram form, controller 200 includes a first input-converter 215 for transforming a voltage signal 216 from distributed generation 110 from stationary coordinates (denoted as ABC) to rotating coordinates (denoted at DQ), and a second input-converter 220 for transforming a current signal 221 from ABC coordinates to DQ coordinates. In an alternative embodiment, first and second input-converters 215, 220 may be integrated into one converter. Voltage signal 216 and current signal 221 may be obtained from voltage sensor 217 and current sensor 222, respectively. The output of first input-converter 215 is depicted as Vd and Vq, which represent the phase voltages with respect to the D and Q axes, respectively, of the rotating coordinate system. The output of second input-converter 220 is depicted as Id and Iq, which represent the phase currents with respect to the D and Q axes, respectively, of the rotating coordinate system. Only one set of DQ voltages and DQ currents are depicted in FIG. 2 for clarity. A frequency signal-generator 225 receives the Vd and Vq output from first input-converter 215 and generates a frequency signal (denoted by w) in response thereto, which is representative of an output frequency of distributed generation 110. In an embodiment, frequency signal-generator 225 is a phase-locked loop (PLL) system operating in DQ coordinates. As used herein, a PLL is an electronic circuit that continuously adjusts to match in phase, and thus lock on to, the frequency of an input signal. The frequency signal w from frequency signal-generator 225 is provided as one of the inputs to an output-converter 230, which receives other control signal inputs Ud and Uq, discussed later, from a current regulator 235. Output-converter 230 transforms the rotating coordinate input signals to a stationary coordinate output signal, which serves as a control signal that is sent to an inverter controller 106 at distributed generation 110 for driving the output voltage and frequency of distributed generation 110 in a direction away from the nominal range in response to electrical grid 120 being disconnected from feeder 140, which will be discussed further later. In an alternative embodiment, inverter controller 106 may be integral with inverter 104. Voltage/frequency monitor 170 initiates a trip action at DG disconnect 130 in response to the voltage and frequency at distributed generation 110 being driven away from the nominal range to a level in excess of a threshold level.

Referring now back to first input-converter 215 in FIG. 2, an embodiment of the invention includes output Vd serving as an input to current-variation signal-generator 240, which includes a bandpass filter 242, an amplifier 244, and a limiter 246. Since the output voltage of first input-converter 215 is a vector composed of a D-axis component, Vd, and a Q-axis component, Vq, a variation in one of the axes, for example, Vd, results in the voltage-variation Δv at the output of bandpass filter 242. Passing the voltage-variation Δv signal through amplifier 244 and limiter 246 results in a current-variation signal Δi at the output of limiter 246. An integrator 250 adds the current-variation signal Δi to the D-axis current reference signal Idref and passes the integrated signal to another integrator 255. Integrator 255 adds the signal from integrator 250 to the D-axis current signal Id from second input-converter 220, thereby modifying the D-axis current signal Id, and passes the integrated signal to current regulator 235. Yet another integrator 260 adds the Q-axis current reference signal Iqref to the Q-axis current signal Iq from second input-converter 220, thereby modifying the Q-axis current signal Iq, and passes the integrated signal to current regulator 235. The output of current regulator 235 consists of the D-axis and Q-axis voltage control signals Ud and Uq, respectively, which are received at output-converter 230 and transformed, along with frequency signal w, as discussed earlier.

Figure 3:
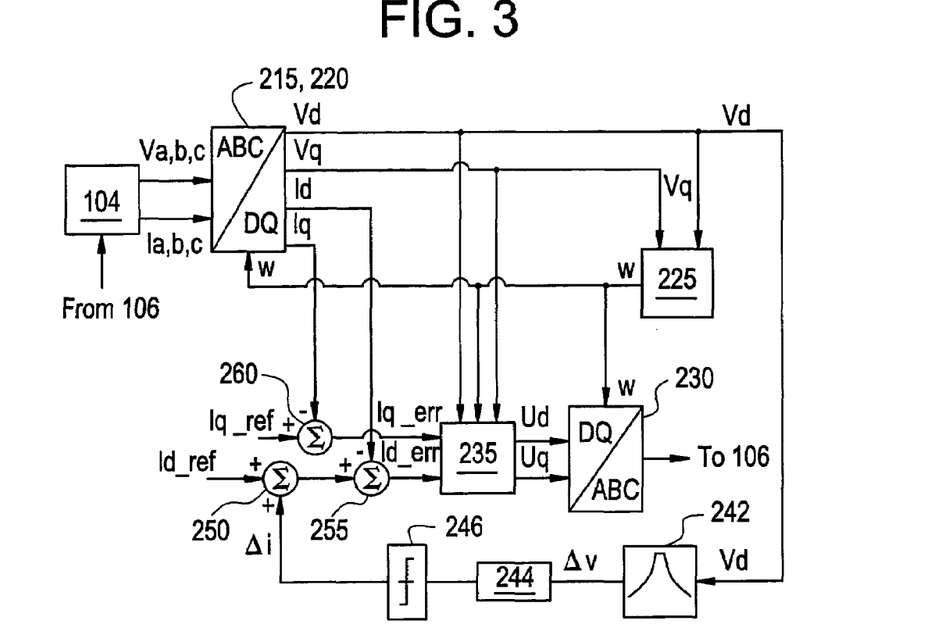
FIGS. 3–8 depict alternative anti-islanding control schemes for use in the anti-islanding controller depicted in FIG. 1.
Figure 4:
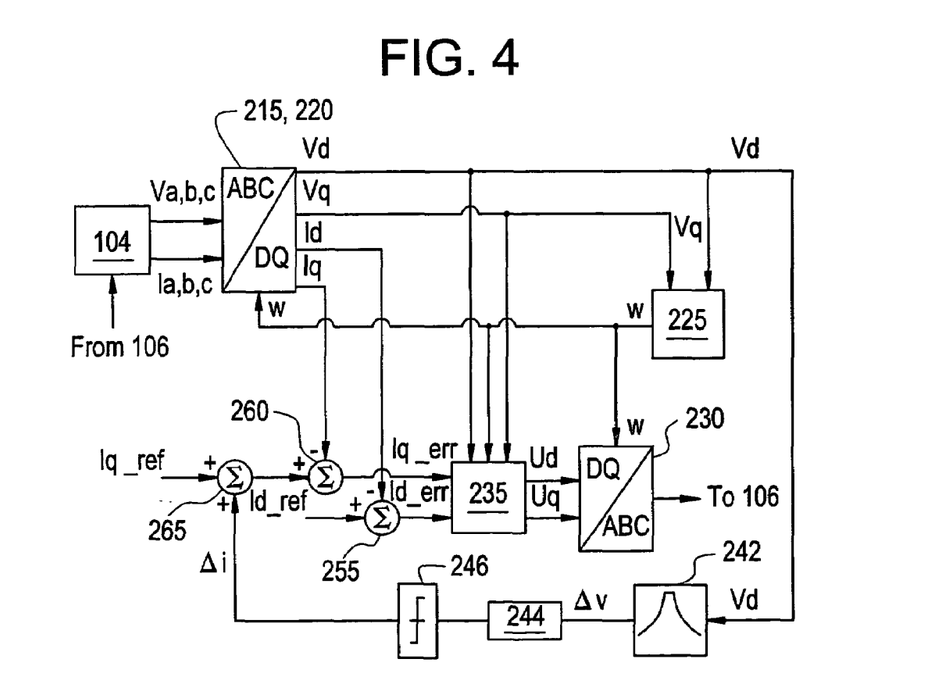
Figure 5:
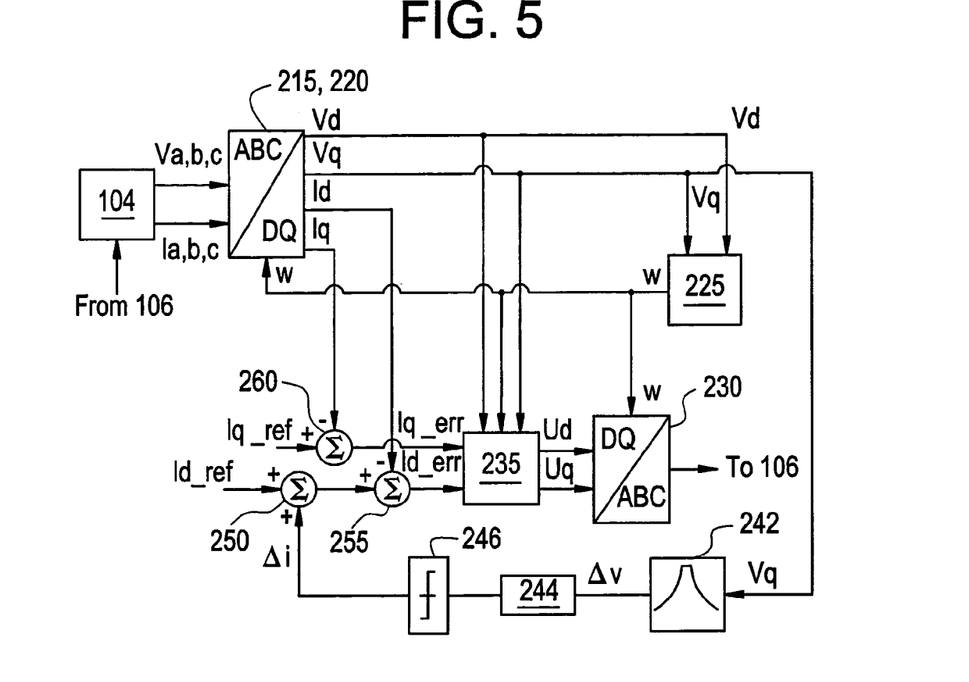
Figure 6:
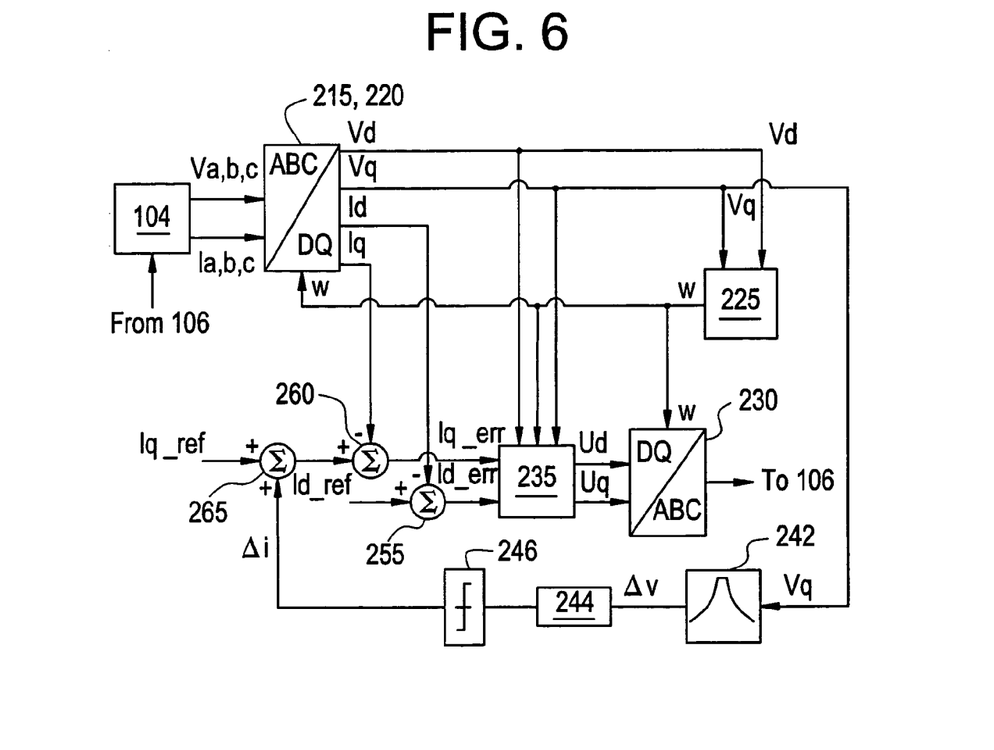
Figure 7:
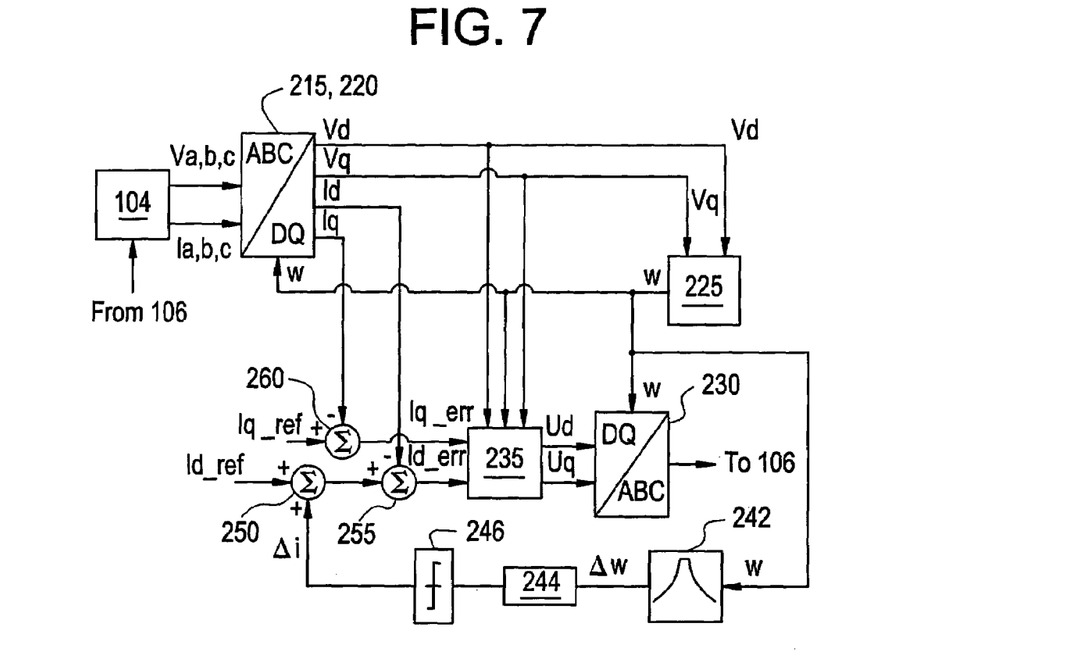
Figure 8:
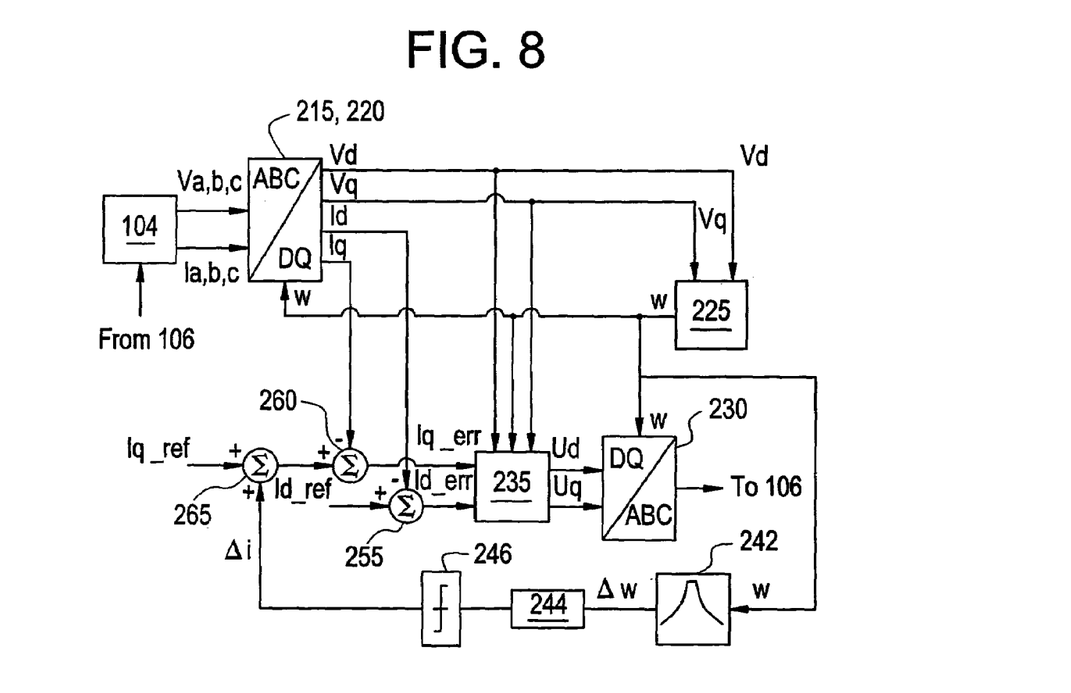
Figure 9:
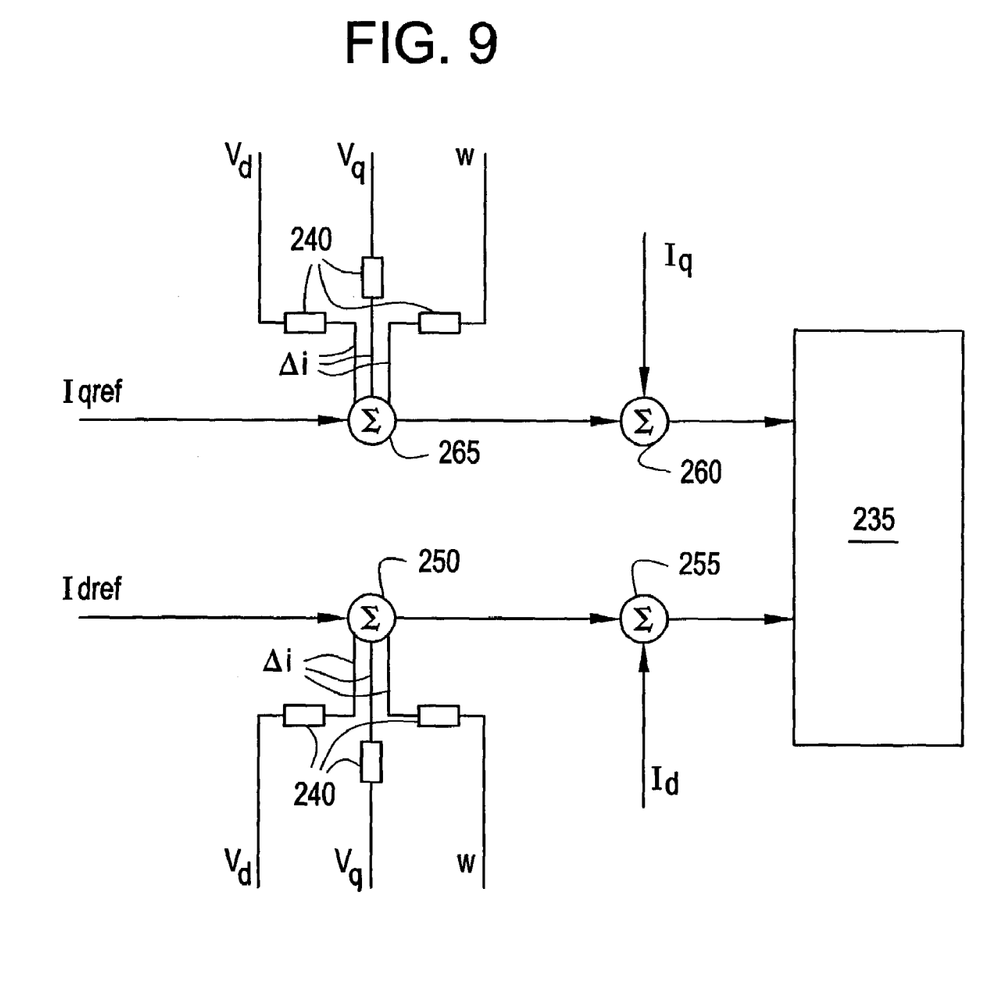
FIG. 9 depicts an integral arrangement of the control schemes depicted in FIGS. 3–8.

While FIG. 2 depicts one feedback loop arrangement having current-variation signal-generator 240 for modifying the D-axis and Q-axis current signals Id and Iq, respectively, from second input-converter 220 before they are received at current regulator 235, other feedback loops may also be employed, which are depicted in FIGS. 3–8. Referring now to FIGS. 3–8, FIG. 3 depicts the same feedback loop arrangement as depicted in FIG. 2 where Idref is modified by Vd, FIG. 4 depicts a feedback loop arrangement where Iqref is modified by Vd, FIG. 5 depicts a feedback loop arrangement where Idref is modified by Vq, FIG. 6 depicts a feedback loop arrangement where Iqref is modified by Vq, FIG. 7 depicts a feedback loop arrangement where Idref is modified by frequency signal w from the output of frequency signal generator 225, and FIG. 8 depicts a feedback loop arrangement where Iqref is modified by frequency signal w. A combination of the six feedback loop arrangements of FIGS. 3–8 is depicted in FIG. 9, which shows four integrators 250, 255, 260, and 265. Integrator 250 serves to modify in DQ coordinates the D-axis current reference signal Idref by adding in the current-variation signal Δi from the current-variation signal-generators 240 in response to the Vd (D-axis voltage), Vq (Q-axis voltage), and w (DQ frequency), signals, while integrator 265 performs a similar operation on the Q-axis current reference signal Iqref. Integrators 255 and 260 modify the Id and Iq signals by adding in the modified Idref and Iqref signals, respectively, which are then sent to current regulator 235. From current regulator 235, signal processing proceeds as discussed earlier.

During operation of controller 200, input converters 215 and 220 transform the voltage and current signals from the power distribution lines of power system 100 from stationary coordinates (ABC) to rotating coordinates (DQ), thereby producing representative voltage and current signals in vector format with respect to the D and Q axes. A voltage change in one axis, resulting from a disconnected electrical grid 120 and detected via a current-variation signal-generator 240, will result in both a voltage magnitude change, via the square root of the sum of the squares of the voltage components on the two axes, and a voltage phase angle change, via the ratio of the components on the D and Q axes. As a result, current regulator 235 will provide control signals Ud, Uq to output converter 230 that will transform an output control signal, determined from Ud, Uq and w, from DQ coordinates to ABC coordinates, which in turn drives both the voltage magnitude and the frequency of distributed generation 110 out of the nominal ranges.

If the voltage at the output of distributed generation 110 has a tendency to increase, the variation of the voltage Δv on the D-axis, for example and as depicted in FIG. 2, will be determined by bandpass filter 242 in current-variation signal-generator 240, the output of which, after amplifier 244 and limiter 246, is a resultant current variation Δi. When electrical grid 120 is connected to distributed generation 110, the voltage variation Δv will be approximately zero because the electrical grid is regulating the voltage at nominal. Even if there is a small voltage variation Δv, the resulting small current variation Δi will not be sufficient to drive the output voltage of distributed generation 110 out of nominal where the electrical grid is strong and the penetration of the distributed generation is low because the electrical grid 120 is holding the voltage. In response to electrical grid 120 being disconnected from distributed generation 110, there is no voltage regulation via the grid. Normally, with a connected grid, the inverter (power conditioner) 104 is controlled as a current source and the output voltage of distributed generation 110 is determined by the inverter current and the characteristics of load 160. For a passive load, such as an R-L-C (resistive-inductive-capacitive) load, an increase in the inverter current will result in an increase in output voltage. As a result, in response to the distributed generation 110 and load 160 being islanded, a voltage variation Δv detected by controller 200 will cause a current variation Δi in the same direction due to the anti-islanding logic of controller 200. In turn, the current variation Δi will cause a further voltage variation Δv at distributed generation 110 in the same direction due to the passive load characteristics. Eventually, the voltage output of distributed generation 110 will be driven away from its nominal value.

If the voltage variation Δv is only on the D-axis and not the Q-axis, the DQ voltage vector will change in both magnitude and phase angle, thereby causing a frequency change. In turn, a variation in frequency Δw will result in a current variation Δi via current-variation signal-generator 240, see FIGS. 7 and 8, which will result in a further frequency change Δw at distributed generation 110 in the same direction due to the passive load characteristics. Eventually, the frequency output of distributed generation 110 will be driven away from its nominal value.

A similar scenario results if the voltage variation Δv is only on the Q-axis and not the D-axis, or if there is a frequency variation on only the D-axis or only the Q-axis, as seen by referring again to FIGS. 3–8. Wherever the voltage or frequency variation occurs, controller 200 will cause the output voltage and frequency of distributed generation 110 to be driven away from their nominal values. In response to an under-voltage, over-voltage, under-frequency, or over-frequency, condition resulting at the output of distributed generation 110, voltage/frequency monitor 170 will detect such condition and initiate a trip action at DG disconnect 130, thereby disconnecting distributed generation 110 from feeder 140 in response to electrical grid 120 being disconnected.

Figure 10:
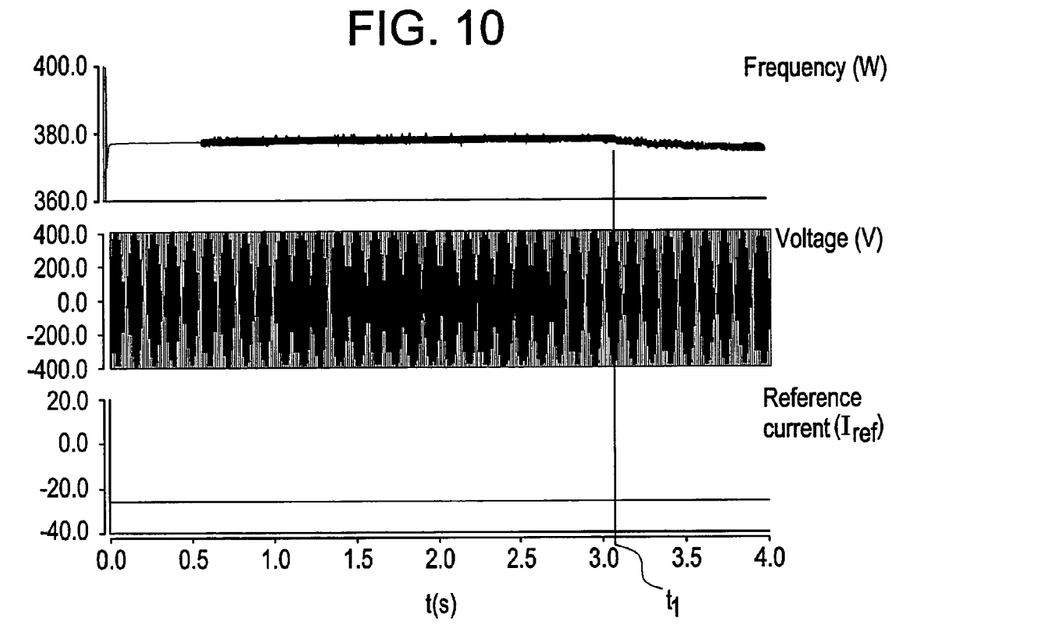
FIG. 10 depicts a simulation output in the absence of an embodiment of the invention.
Figure 11:
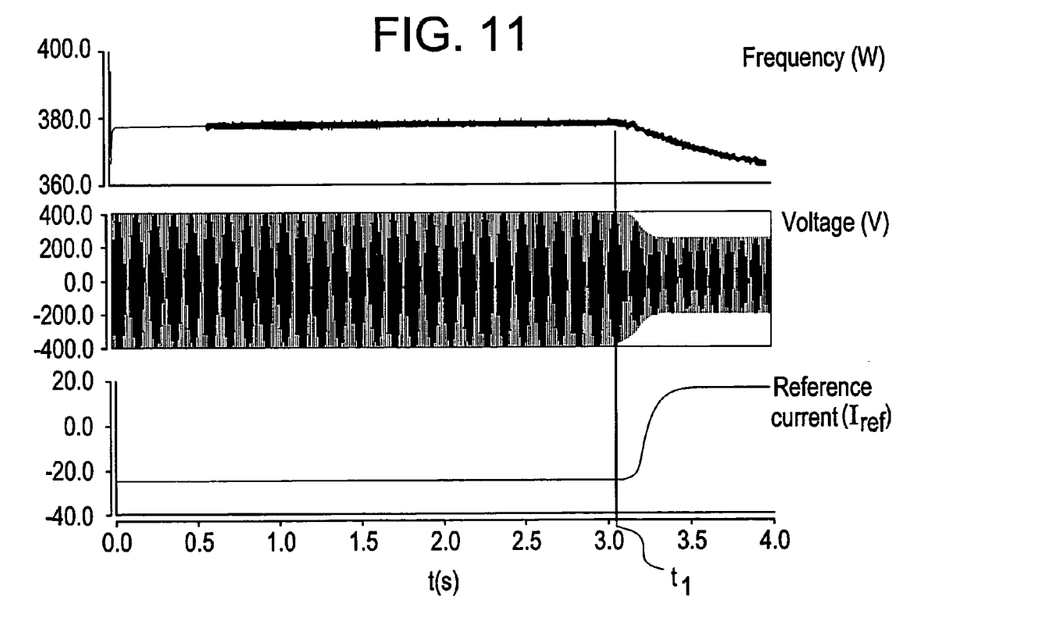
FIG. 11 depicts a simulation output in the presence of an embodiment of the invention.

Embodiments of the invention as depicted in FIGS. 2, 3 and 8, have been simulated using analytical software such as Saber Simulator™ software, available from Synopsys, Inc. Here, the band of bandpass filter 242 was selected as being about 1 Hz (Hertz) to about 10 Hz, the gain of amplifier 244 was selected to provide a positive feedback loop gain of about 20 dB (decibels), and the threshold level of limiter 246 was selected to prevent the positive feedback from exceeding a predefined level during transient conditions. If the band of the bandpass filter is too high, the feedback loop may be too noise sensitive, and if it is too low, the response of the anti-islanding controller 200 may be too slow to meet the tripping requirement. FIG. 10 depicts the simulation results in the absence of anti-islanding controller 200, and FIG. 11 depicts the simulation results in the presence of an embodiment of anti-islanding controller 200. With respect to each FIGS. 10 and 11, the top curve represents an output frequency, the center curve represents an output voltage, and the bottom curve represents a reference current of a phase of distributed generation 110. By comparing FIGS. 10 and 11 after time t1 where electrical grid 120 is disconnected from feeder 140, it can be seen that the presence of controller 200 in accordance with an embodiment of the invention results in a greater change in frequency and voltage at the output of distributed generation 110 than does an arrangement absent controller 200. A greater change in reference current, Idref for example, can also be seen between FIGS. 10 and 11 after time t1. In response to these changes being above or below a trip threshold, voltage/frequency monitor 170 initiates a trip action at DG disconnect 130.

In summary, an embodiment of the invention provides a family of active anti-islanding schemes that are implemented in rotating coordinates for use in grid-connected inverters. The inverters are used to convert DC power sources to AC output, which are connected to the electrical grid. The measurements and controls, including phase-locked loop, are transformed into and performed in DQ coordinates. The variation of the phase-locked loop output, such as frequency w, or the inverter output voltage in one of the DQ coordinates, such as Vd or Vq, is fed back to the current references in one of the DQ coordinates, such as Idref or Iqref, or if the inverter is constant-power controlled, is fed back to the power references, such as Pref or Qref. As a result, when the inverters are islanded, the feedback loop of an embodiment of controller 200 will drive both the voltage and frequency of the inverter away from their nominal ranges, which in turn will be detected and acted upon by the voltage/frequency monitor 170 and DG disconnect 130, thereby providing islanding detection and protection.

An embodiment of the invention may be provided in executable instruction form on a storage medium 210 that is readable by a processing circuit 205, the processing circuit 205 being in signal communication via application software with a graphical user interface at a computer, whereby a user may execute the embedded instructions for practicing the disclosed invention.

As disclosed, some embodiments of the invention may include some of the following advantages: negligible impact on the inverter output power quality when the inverters are connected to the electrical grid due to the control scheme being implemented in DQ coordinates with continuous functioning; rapid detection of islanding in response to a disconnected electrical grid; and, application to single-phase and multi-phase inverters.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. An apparatus for anti-islanding protection of a distributed generation with respect to a feeder connected to an electrical grid, the apparatus comprising:
   a sensor adapted to generate a voltage signal representative of an output voltage at the distributed generation, a current signal representative of an output current at the distributed generation, or any combination of signals comprising at least one of the foregoing; and
   a controller responsive to the signals from the sensor, and productive of a control signal directed to the distributed generation to drive an operating characteristic of the distributed generation out of a nominal range in response to the electrical grid being disconnected from the feeder;
   wherein the controller is configured to analyze the sensor voltage and current als in a vector format such that the resulting control signal is capable of driving both a voltage magnitude and a frequency magnitude of the distributed generation out of a nominal range.

2. The apparatus of claim 1, further comprising:
   a monitor responsive to the operating characteristic of the distributed generation being driven out of a nominal range, and productive of a trip signal for disconnecting the distributed generation from the feeder.

3. The apparatus of claim 1, wherein the operating characteristic is an output voltage, an output frequency, or both an output voltage and an output frequency of the distributed generation.

4. The apparatus of claim 1, wherein:
the controller is adapted to transform the signals from the sensor from stationary coordinates to rotating coordinates, generate a control signal in rotating coordinates, transform the control signal from rotating coordinates to stationary coordinates to produce an output control signal, and send the output control signal to the distributed generation.

5. The apparatus of claim 4, further wherein: the controller is adapted to:
in rotating coordinates, generate a frequency signal representative of a frequency at the distributed generation;
in rotating coordinates, modify at least one of a current reference and a power reference in response to at least one of the voltage signal, the current signal, and the frequency signal; and
in rotating coordinates, generate the control signal in response to a modified current reference or power reference.

6. The apparatus of claim 5, further wherein: the controller is adapted to:
in rotating coordinates, generate a voltage variation signal in response to the voltage signal;
in rotating coordinates, generate a frequency variation signal in response to the frequency signal;
in rotating coordinates, generate a current variation signal in response to at least one of the voltage variation signal, and the frequency variation signal; and
modify the current reference in response to the current variation signal.

7. A controller for anti-islanding protection of a distributed generation with respect to a feeder of an electrical grid, the distributed generation adapted for connection to the feeder via a distributed generation disconnect, the distributed generation disconnect responsive to a voltage/frequency monitor, the controller comprising:
an input converter adapted to transform a voltage signal from the distributed generation from stationary coordinates to rotating coordinates;
an input converter adapted to transform a current signal from the distributed generation from stationary coordinates to rotating coordinates;
a frequency signal generator adapted to provide a frequency signal representative of an output frequency of the distributed generation;
a current regulator adapted to provide a control signal to the distributed generation;
an integrator responsive to the voltage signal, the current signal, the frequency signal, or any combination comprising at least one of the foregoing signals, and adapted to provide an integrated signal to the current regulator; and
an output converter responsive to the control signal, the frequency signal, or any combination comprising at least one of the foregoing signals, and adapted to transform the control signal from rotating coordinates to stationary coordinates;
wherein a disconnected electrical grid results in the voltage and/or frequency at the distributed generation being driven away from a nominal range and the distributed generation disconnect being opened, thereby isolating the distributed generation with respect to the feeder.

8. The controller of claim 7, further comprising:
a current variation signal generator responsive to the voltage signal in rotating coordinates and adapted to provide a current variation signal to the integrator.

9. The controller of claim 7, wherein the frequency signal generator comprises a phase-locked loop operational in rotating coordinates.

10. The controller of claim 9, further comprising:
a current variation signal generator responsive to the frequency signal in rotating coordinates and adapted to provide a current variation signal to the integrator.

11. The controller of claim 8, wherein the current variation signal generator comprises a bandpass filter, an amplifier, and a limiter.

12. The controller of claim 10, wherein the current variation signal generator comprises a bandpass filter, an amplifier, and a limiter.

13. The controller of claim 7, wherein:
in response to a disconnected electrical grid, the control signal drives the voltage and/or frequency at the distributed generation away from a nominal range in such a manner that an over voltage condition, and under voltage condition, an over frequency condition, an under frequency condition, or any combination comprising at least one of the foregoing conditions, results at the distributed generation.

14. The controller of claim 7, further comprising:
a plurality of signal paths adapted to receive and communicate signals with respect to a single-phase two-wire distributed generation, a two-phase three-wire distributed generation, a three-phase three-wire distributed generation, a three-phase four-wire distributed generation, or a multi-phase inverter.

15. A method for anti-islanding protection of a distributed generation with respect to a feeder connected to an electrical grid, the method comprising:
determining an output voltage of the distributed generation;
determining an output current of the distributed generation;
determining an output voltage variation of the distributed generation;
modifying a current reference of the distributed generation in response to the output voltage variation;
determining an output frequency of the distributed generation in response to the output voltage; and
providing a control signal in response to the output current, the modified current reference, and the output frequency, for disconnecting the distributed generation from the feeder in response to the electrical grid being distributed from the feeder.

16. The method of claim 15, wherein the providing a control signal further comprises:
providing a control signal such that both the output voltage and the output frequency of the distributed generation are driven out of their respective nominal ranges.

17. The method of claim 15, further comprising:
transforming a signal representative of the output voltage in stationary coordinates to a signal representative of the output voltage in rotating coordinates; and
wherein the modifying a current reference comprises determining a current variation in response to the output voltage variation and integrating the current variation with the current reference.

18. The method of claim 15, further comprising:
determining a frequency variation; and
modifying the current reference in response to the frequency variation.

19. The method of claim 18, wherein:
the modifying a current reference comprises deter a current variation in response to the frequency variation and integrating the current variation with the current reference.

20. A computer program product for anti-islanding protection of a distributed generation adapted for signal communication with an electrical grid, the program comprising:
a storage medium, readable by a processing circuit, storing instructions for execution by the processing circuit for:
determining an output voltage of the distributed generation;
determining an output current of the distributed generation;
determining an output voltage variation of the distributed generation;
modifying a current reference of the distributed generation in response to the output voltage variation;
determining an output frequency of the distributed generation in response to the output voltage; and
providing a control signal in response to the output current, the modified current reference, and the output frequency, for disconnecting the distributed generation from a feeder in response to the electrical grid being disconnected from the feeder.

21. The program of claim 20, further comprising instructions for execution by the processing circuit for:
providing a control signal such that both the output voltage and the output frequency of the distributed generation are driven out of heir respective nominal ranges.

22. The program of claim 20, further comprising instructions for execution by the processing circuit for:
transforming a signal representative of the output voltage in stationary coordinates to a signal representative of the output voltage in rotating coordinates; and
wherein the instructions for modifying a current reference comprises instructions for determining a current variation in response to the output voltage variation and instructions for integrating the current variation with the current reference.

23. The program of claim 20, further con-rising instructions for execution by the processing circuit for:
determining the output frequency in rotating coordinates and determining a frequency variation therefrom; and
modifying the current reference in response to the frequency variation.

24. The program of claim 23, wherein:
the instructions for modifying the current reference comprises instructions for determining a current variation in response to the frequency variation and instructions for integrating the current variation with the current reference.

25. An apparatus for anti-islanding protection of a distributed generation with respect to a feeder connected to an electrical grid, the apparatus comprising:
means for determining an output voltage of the distributed generation;
means for determining an output current of the distributed generation;
means for determining an output voltage variation of the distributed generation;
means for modifying a current reference of the distributed generation in response to the output voltage variation;
means for determining an output frequency of the distributed generation; and
means for providing a control signal in response to the output current, the modified current reference, and the output frequency, for disconnecting the distributed generation from the feeder in response to the electrical grid being disconnected from the feeder.

26. The apparatus of claim 25, wherein the means for providing a control signal further comprises:
means for providing a control signal such that both the output voltage and the output frequency of the distributed generation are driven out of their respective nominal ranges.

27. The apparatus of claim 25, further comprising means for transforming a signal representative of the output voltage in stationary coordinates to a signal representative of the output voltage in rotating coordinates;
wherein the means for determining an output voltage variation comprises a bandpass filter; and
wherein the means for modifying a current reference comprises means for determining a current variation in response to the output voltage variation and means for integrating the current variation with the current reference.

28. The apparatus of claim 27, wherein the means for determining a current variation comprises an amplifier and a limiter.

29. The apparatus of claim 25, wherein:
the means for determining an output voltage comprises means for determining an output under voltage, means for determining an output over voltage, or any combination comprising at least one of the foregoing means; and
the means for determining an output frequency comprises means for determining an output under frequency, means for determining an output over frequency, or any combination comprising at least one of the foregoing means.

30. The apparatus of claim 25, wherein the means for determining an output frequency comprises a phase-locked loop operational in rotating coordinates, and further comprising:
means for determining a frequency variation; and
means for modifying the current reference in response to the frequency variation.

31. The apparatus of claim 30, wherein:
the means for determining a frequency variation comprises a bandpass filter; and
the means for modifying a current reference comprises means for determining a current variation in response to the frequency variation and means for integrating the current variation with the current reference.

32. The apparatus of claim 31, wherein the means for determining a current variation comprises an amplifier and a limiter.

33. The apparatus of claim 25, wherein the distributed generation comprises a single-phase two-wire distributed generation, a two-phase three-wire distributed generation, a three-phase three-wire distributed generation, a tree-phase four-wire distributed generation, or a multi-phase inverter.

* * * * *

UNITED STATES PATENT AND TRADEMARK OFFICE
CERTIFICATE OF CORRECTION

PATENT NO. : 7,016,793 B2  
APPLICATION NO. : 10/677559  
DATED : March 21, 2006  
INVENTOR(S) : Ye et al.

It is certified that error appears in the above-identified patent and that said Letters Patent is hereby corrected as shown below:

Column 8:  
Line 59, after "current" delete "als" and insert therefor -- signals --

Column 11:  
Line 6, after "comprises" delete "deter" and insert therefor -- determining --  
Line 35, after "of" delete "heir" and insert therefor -- their--  
Line 47, after "further" delete "con-rising" and insert therefor -- comprising --

Column 12:  
Line 64, after "a" delete "tree" and insert therefor -- three --

Signed and Sealed this

Eighth Day of August, 2006

JON W. DUDAS  
*Director of the United States Patent and Trademark Office*